(12) United States Patent
Yatskov et al.

(10) Patent No.: US 6,302,705 B1
(45) Date of Patent: Oct. 16, 2001

(54) ELECTRICAL CIRCUIT CONNECTOR WITH SUPPORT

(75) Inventors: Alexander I. Yatskov, Kenmore; Mario L. Jaena, Kent, both of WA (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 09/602,573

(22) Filed: Jun. 22, 2000

(51) Int. Cl.⁷ .................................................. H01R 12/00
(52) U.S. Cl. ............................................................ 439/67
(58) Field of Search ............................ 439/67, 493, 495, 439/329, 545

(56) References Cited

U.S. PATENT DOCUMENTS

| | | | |
|---|---|---|---|
| 4,116,516 | * | 9/1978 | Griffin ..................................... 439/67 |
| 4,894,015 | * | 1/1990 | Stockero et al. ........................ 439/67 |
| 5,186,638 | * | 2/1993 | Pusch .................................... 439/140 |
| 5,195,897 | * | 3/1993 | Kent et al. ............................... 439/67 |
| 6,017,222 | * | 1/2000 | Kao ........................................ 439/67 |
| 6,027,366 | * | 2/2000 | Mori et al. ............................. 439/495 |
| 6,053,747 | * | 4/2000 | Aggus et al. ............................ 439/67 |

* cited by examiner

Primary Examiner—Tulsidas Patel
(74) Attorney, Agent, or Firm—Seed IP Law Group PLLC

(57) ABSTRACT

An electrical connector includes a flexible conductor extending between a pair of mechanical connectors to electrically couple circuits. A supporting member is positioned between the mechanical connectors to reduce twisting of the flexible circuit substrate. The supporting member is cambered to permit the mechanical connectors to translate with respect to one another.

37 Claims, 4 Drawing Sheets

US 6,302,705 B1

ELECTRICAL CIRCUIT CONNECTOR WITH SUPPORT

TECHNICAL FIELD

This invention relates to electrical connectors, and more particular to electrical connectors for coupling circuits on printed circuit boards.

BACKGROUND OF INVENTION

Many computing devices, such as desktop computers, workstations, main-frame and super-computers employ multiple printed circuit boards ("PCB") that include various microprocessors, printed circuits and other components that must be electrically coupled together to transmit data and/or power. The electrical traces on one or more layers of the PCB form the printed circuits and typically terminate in one or more terminals or contacts for making connections. Every decreasing element sizes, such a pitch (i.e., the spacing between successive components), width, and height, exacerbate the problem of providing secure and reliable connections between the printed circuits. Precise positioning on the order of thousandths of an inch is often necessary. Consistent pressure across each of the many contacts is also desirable to assure a reliable connection. A single failed or intermittent connection can result in large amounts of "down-time" for the computing device, and costly trouble-shooting by highly skilled technicians.

Highly parallel processing super-computers present a particularly significant problem in terms of space constraints. Super computers rely on a high number of connections between circuit boards that each carry one or more microprocessors. The nature of parallel processing places high demands on the timing of signals, including clock signals across the various computer components. The PCBs are spaced relatively close together to reduce the length of the connections between the PCBs in an effort to improve the timing of the signals. The tight spacing hinders the ability of technicians to access particular computer components, such as the PCBs and electrical connectors. This presents a particular problem to computer manufacturers and owners who desire a modular design that permits failed components to be quickly and easily replaced. If serviceable, a modular design would also permit the addition of new or additional processors as desired, for example when more processing power is required or when the processors become more affordable. This could significantly extend the life of the computing device.

SUMMARY OF THE INVENTION

According to principles of the present invention, a supporting member extends between a pair of mechanical connectors that are coupled to a pair of printed circuit boards. The support member is adjacent a flexible electrical conductor to provide mechanical support to the electrical wiring. The support member significantly limits rotation or twisting of the flexible electrical conductor. According to one embodiment, the supporting member is curved or cambered to permit the mechanical connectors to be rotated with respect to one another, while limiting rotation of the electrical conductor.

BRIEF DESCRIPTION OF THE DRAWINGS

In the drawings, identical reference numbers identify similar elements or acts. The sizes and relative positions of elements in the drawings are not necessarily drawn to scale and various elements and portions of elements may be are arbitrarily enlarged and positioned to improve drawing legibility.

DETAILED DESCRIPTION OF THE INVENTION

Figure 1:
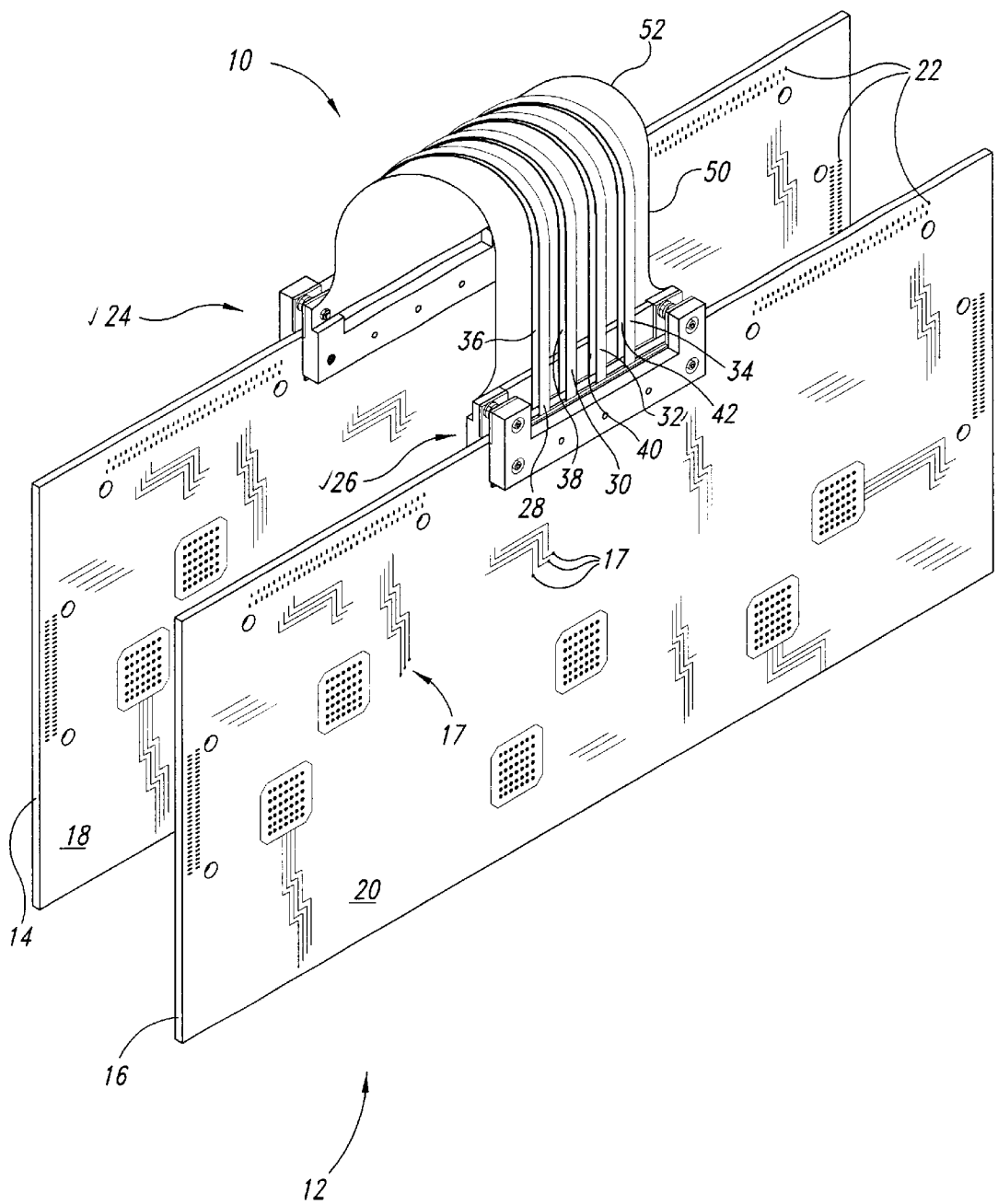
FIG. 1 is an isometric view of a connector according to the present invention coupling a pair of circuits on two printed circuit boards in side-by-side relation.

FIG. 1 shows a connector 10 coupling printed circuit boards 12 ("PCBs") according to the present invention. The connector 10 includes a first and second clamps 24, 26, and a first set of electrical conductors 28–34, such as four flexible circuit substrates 28–34, electrically coupling circuits on the first PCB 14 to circuits on the second PCB 16. The connector 10 also includes a flexible support member 50 that provides mechanical support and stability to the connection.

Figure 2:
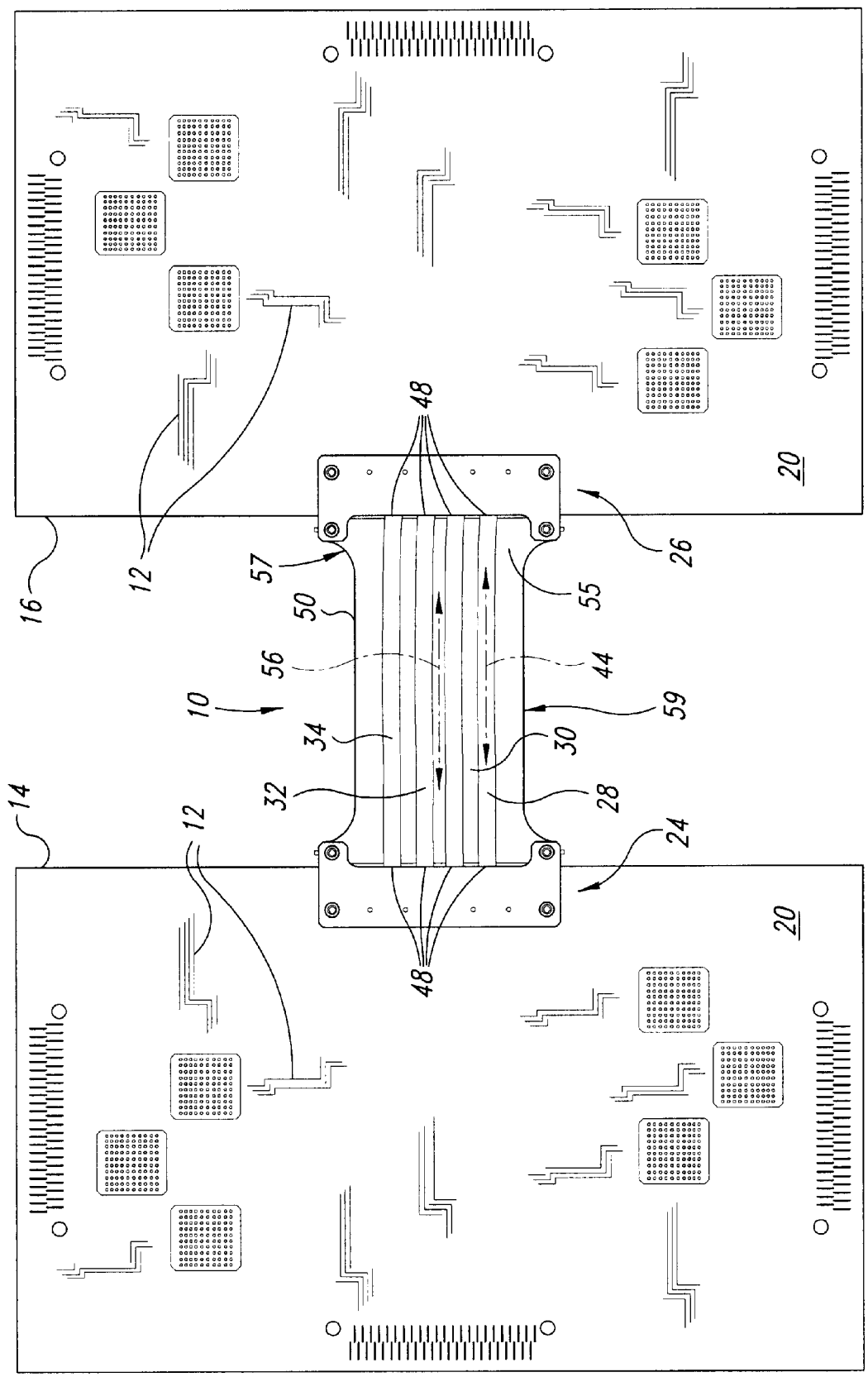
FIG. 2 is a top plan view of the connector according to the present invention coupling a pair of circuits on two printed circuit boards in parallel relation.

FIG. 1 shows the first printed circuit board ("PCB") 14, and the second PCB 16, in a side-by-side, parallel arrangement. FIG. 2 shows the connector 10 coupling circuits on the first and second PCBs boards 14, 16, where the PCBs 14, 16, are in the same plane. The circuit boards are of a type used in a super computer or large mainframe computer. Thus, each board will have many electronic components, including many microprocessors. A single computer may have a dozen or more boards with different positions with respect to each other that must be connected. While parallel and side-by-side connections are shown, they may also be stacked, one above another or be arranged in some other configuration.

The PCBs 12 are formed from one or more layers of an insulating material, such as FR-4 epoxy-fiberglass laminate. The PCBs 12 are typically sufficiently thick to form a rigid substrate, although minor amounts of bending or deflection can occur. The printed circuits include electrically conductive circuit traces and various electrical and electronic components (not shown) on one or both surfaces 18 and 20. Each layer of the PCB 14, 16 can also carry circuit traces (not shown) where the PCB 14, 16 is a laminate structure. Through-holes 17 can provide connections between circuit traces 13 on outer surfaces 18, 20 and/or inner layers of the PCB 14, 16. The printed circuits include electrical contacts 22 to coupled the printed circuits to other electrical circuits. The electrical contacts 22 are located close to the edges of the PCB 14, 16 to make the coupling easier.

Electrical conductors 28–34 extend into the clamps and have exposed contacts for connecting to contacts on the printed circuit board. The details of this electrical connection need not be described here since any general type of electrical contacts can be used within the concept of this invention. For example, an electrical socket type of connector could be used in place of the clamps 24 and 26. Similarly, any other acceptable electrical connectors for contact with the boards 14 and 18 may be used, such as male/female sockets, plugs, surface-mount contacts, sliding electrical connectors or any acceptable connectors to electrically connect the conductors 28–34 to the contacts on the respective boards 14 and 16.

Accordingly, the invention is directed toward a connector 10 having a mechanical support member 50 that extends between connectors 24 and 26 to retain electrical conductors 28–34 in a stress-free and straight condition when in use and when at rest and also when one board is being replaced.

The electrical conductors 28–34 can be of any acceptable type. Ribbon cable strips, electrical cables, or flexible circuit substrates can be used. The invention is particularly helpful with ribbon strips and flexible substrates as will now be explained. Use of flexible circuit substrates 28–34 provide low resistance, low impedance connections. Such electrical conductors are particularly desirable in parallel processing systems, where the timing of signals is critical. The flexible circuit substrates 28–34 include electrical traces formed on one or more layers (approximately 2–8) of insulated substrate material. The substrate can be printed circuit board material (e.g., polyimide film, FR-4 epoxy-fiberglass laminate), or any acceptable alternatives. The resulting substrate is highly flexible, hence convenient for making connections in tight spaces and/or at an angle and yet is quite strong.

Over-flexing of electrical conductors, such as ribbon cables and flexible circuit substrates can lead to defects in electrical conductors and traces and/or layers thus causing open circuits and/or short circuits. The flexible circuit substrates 28–34 are particularly susceptible to failure caused by twisting or rotation about a longitudinal axis 44 of the traces, where the traces typically run along the length of the flexible circuit substrate 28–34 between a set of contacts (not shown) located at each end 48 of the flexible circuit substrate 28–34. The present invention solves this problem.

The connector 10 also includes a mechanical support 50 coupling the first and second clamps 24, 26 to each other. The support 50 can be any acceptable flexible member, such as a leaf spring, metal plate or other mechanical support, to significantly reduce twisting or rotation about the longitudinal axis 44 of the traces and flexible circuit substrates 28–34. Use of a leaf spring 50 for the support provides a resiliently deformable steel plate, having a prebuilt curve or camber 52 that permits translation along a longitudinal axis 56 while reducing rotation about the longitudinal axis 56. The curve is selected to permit easy manipulation of the connector 10 in space restricted areas, such as between PCBs 14, 16 inside super computers. The leaf spring 50 is designed in each application to be sufficiently stiff to support the weight of the clamps 24, 26. The stiffness is a function of the material, the thickness, width, length and curvature or camber of the leaf spring 50. The leaf spring 50 is made sufficiently stiff to prevent the weight of the first clamp 24 from causing twisting or rotating the flexible circuit substrates 28–34 about the longitudinal axis 56 if it is unclamped from the respective PCB 16 while the second clamp 26 is connected. Twisting can particularly be a problem when the PCBs 14, 16 are arranged as shown in FIG. 2, where gravity would tend to pull the clamp 24 downward if it is disconnected. The leaf spring 50 thus provides the mechanical support to ensure that the electrical conductors 28–42 are not destroyed when one of the clamps is disconnected and hangs free at one end.

The shape of the leaf spring 50 is selected to be strong, yet flexible. An enlarged portion 55 connects to the respective clamps 24 and 26. A necked down region 57 has a smooth curve to gradually reduce the body width 59 of the leaf spring to the desired value with the proper spring constant and flexibility, yet sufficient strength. The width and thickness of the body 59 are selected to provide the desired strength and flexibility. A wider and/or thicker body will have a higher spring constant and will be more stiff. A somewhat thinner leaf spring body 59 provides more flexibility yet less support strength. The width and thickness of the leaf spring body 59 is selected to provide the adequate strength and spring constant with sufficient flexibility based on the weight of the clamps and the respective orientation of the PCBs being connected.

The invention also has the advantage of providing a spring-loaded connection of the clamps 24 and 26 between the PCBs. The leaf spring 50 has a preselected spring bias loaded in a certain direction as manufactured. This is well-known for leaf springs, and upon manufacture can be predesigned to have a desired curvature and camber when unstretched, as will now be explained.

Figure 3:
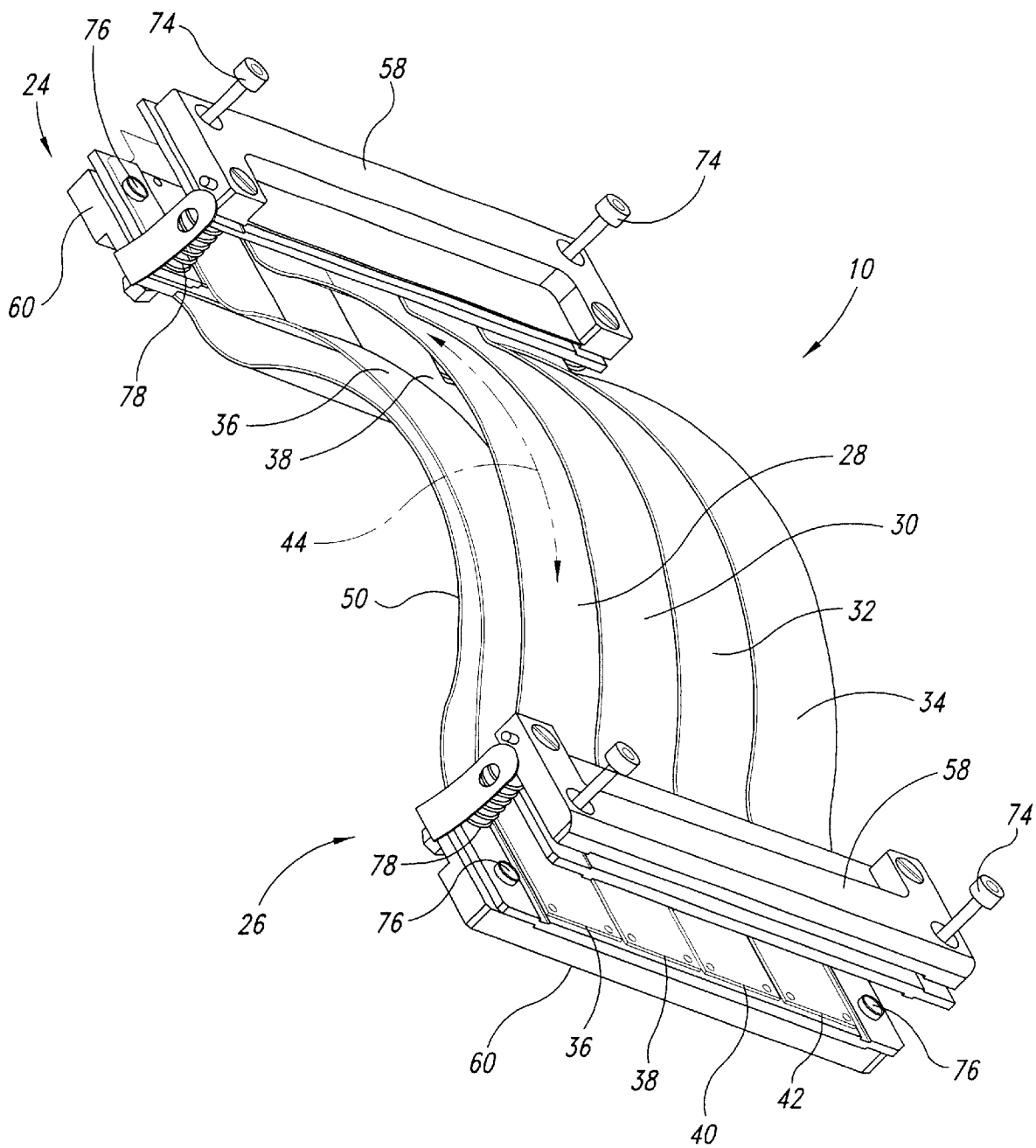
FIG. 3 is a top, isometric view of the inventive connector.
Figure 4:
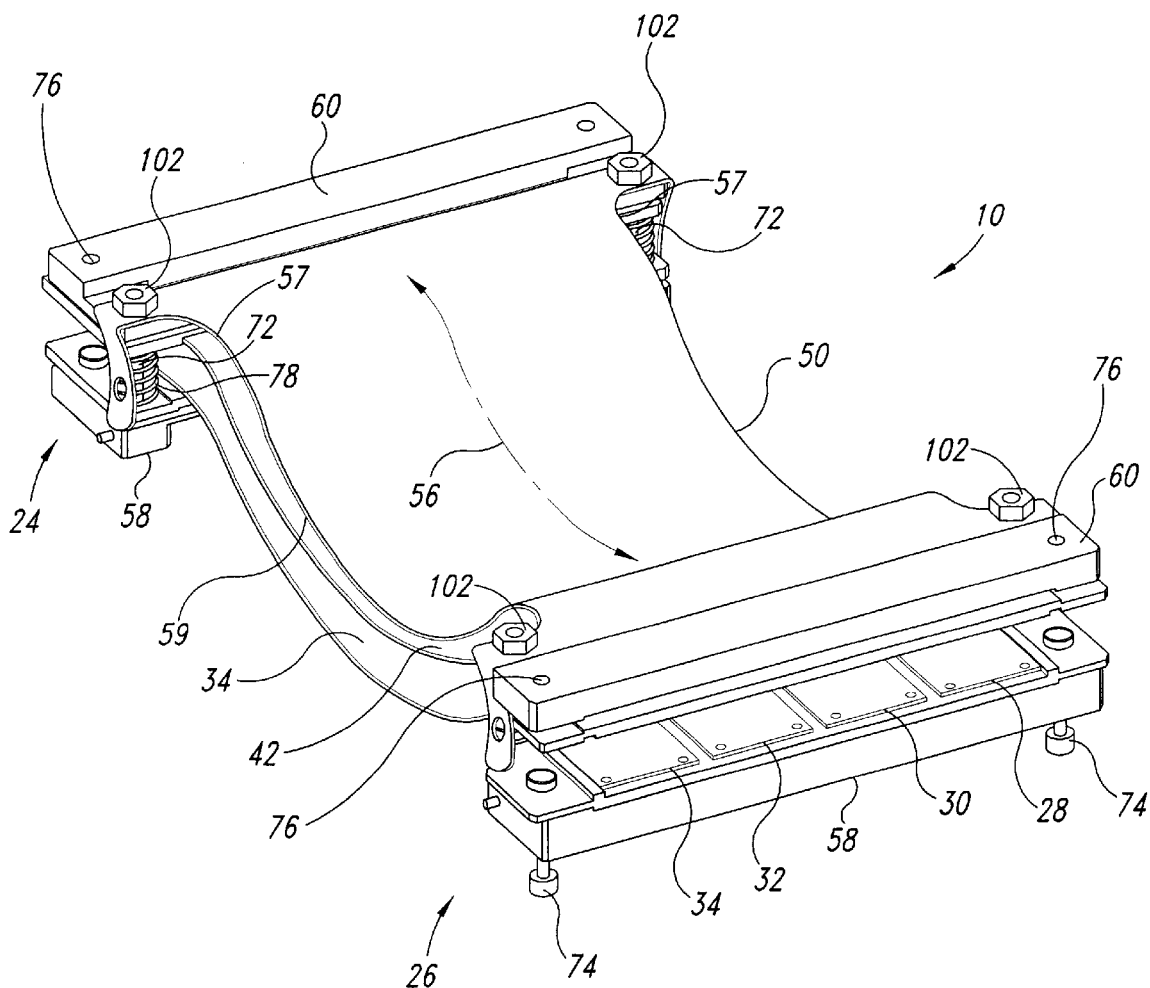
FIG. 4 is a partial, bottom, rear isometric view of the connector of FIG. 3.

FIGS. 3 and 4 illustrate examples of the leaf spring 50 in an unloaded and unstretched condition. The leaf spring 50 has a curvature and preset camber as determined when it was manufactured. The strength of its spring force is based on its width, thickness, and type of materials, as described herein. In an at-rest condition, the leaf spring 50 holds the clamps 24 and 26 a preselected distance away from each other. The electrical conductors 28–42 are assured of being retained in a smooth nonbinding relationship since they are held in position by the leaf spring 50. The electrical conductors 28–42 therefore will not twist, turn, or become entangled when at rest since the leaf spring extended between the clamps 24 and 26 with the support 50 holding them in a selected orientation. The connector 10 can thus remain at rest or be shipped from one location to another with high reliability and assurance that the electrical conductors 28–34 will not be damaged nor entangled.

The connector 10 is installed on the printed circuit boards 14 and 16 as follows. The connector 24 is positioned in the correct location to provide proper electrical contact to the printed circuit board 14 at the contact points on the printed circuit board. Alignment pins in the connector extend through holes in the printed circuit board to ensure proper alignment. While this alignment is being carried out, the leaf spring 50 holds the electrical conductors 28–34 in a firm, yet flexible orientation. The operator thus does not need to be concerned about entangling or damaging the electrical conductors while first clamp 24 is being aligned with the circuit board 14. Upon alignment being completed, the first connector 24 is coupled to a first printed circuit board 14 with the second end hanging free.

After the clamp 24 is connected, the user then connects clamp 26 to the other circuit board. This is done by stretching the leaf spring 50 so as to bias it in a spring-loaded condition. Once the leaf spring 50 is biased to its proper location, the clamp 26 is connected to the second printed board 16. The leaf spring 50 is thus in a loaded condition providing a resilient connection between the clamps 24 and 26 to the printed circuit boards 14 and 16. It is generally a very light spring force to not place an undue load on PCBs 14 and 16. The electrical conductors 28–34 thus do not carry the stress of supporting the clamps 24 and 26. The leaf spring 50 provides mechanical support for the electrical conductors so that they may rest upon the leaf spring and be supported thereby if desired. Other types of electrical conductors, such as the flexible circuit substrates, will be spaced above and generally not touch the leaf spring. In one embodiment, the electrical conductors are side by side as shown in FIGS. 1 and 2; in other embodiments, they may be spaced one above the other in a stacked relationship, as seen from conductors 28 and 36 having a space 38 therebetween, shown in FIG. 3.

The leaf spring 50 remains in its spring-loaded condition while the circuit boards 14 and 16 are within the housing of the computer, normally a supercomputer which may have dozens of such boards therein. At some time, it may be necessary to remove one of the boards 16 from the super computer and replace it with a different board. The connector 10 makes such a change quick and easy, while assuring that no damage will be done to the electrical conductors 28–42 or to any adjacent boards. According to principles of the present invention, the clamp 26 is loosened and removed from the board 16. The operator can then let go of the clamp 26 and let one end hang free so that the entire connector 10 is supported by the circuit board 14. The leaf spring 50, since it is preshaped, will automatically move back to the rest position and thus will spring away from circuit board 16 in a motion which does not interfere with or impact other portions of the circuit board 16. The clamp 26 thus is automatically swung free by the retraction of the leaf spring 50 and can be assured of not impacting or causing damage to other locations inside the supercomputer when it is not connected. The leaf spring 50 returns to its rest condition and holds the clamp 26 in a suspended location determined by the preset shape of the spring 50 when manufactured, as previously discussed. The clamp 26 can thus hang free for an extended period of time while the electrical conductors 28–42 are supported without fear of entanglement or damage. When a new board 16 is provided in the slot in the supercomputer, it is slid into location quickly and easily. Since the clamp 26 is held by the leaf spring 50 in a preset position, the user can be assured of inserting the board 16 smoothly and cleanly without becoming entangled in the electrical conductors. Once the board is in place, the operator engages the clamp 26 onto the board 16 by stretching the leaf spring 50 as desired and clamping the connector 10 to the board 16. The electrical connection is thus quickly and cleanly made to the circuit board 16 and operation of the supercomputer continues. Indeed, if used in a super computer, the invention may permit it to remain operating while the board is being replaced, and the connector 10 assures that no damage to the electrical circuits nor interference with other boards will occur during the replacement.

In an alternative embodiment, the mechanical support 50 is not a leaf spring. Instead it is a support member that holds the electrical conductors in a safe position to prevent damage to the wires or tangling of wires. Thus, in the embodiment when the connector 50 is not a spring, it will hold the clamps 24 and 26 in the proper position, as well as the electrical wires 28–34 but it will not spring back into position to automatically swing away from the board 26 when it is unclamped.

FIG. 3 shows the first and second clamps 24, 26, and the flexible circuit substrates 28–34 in more detail than FIGS. 1 and 2. Only one of the clamps is described since the first and second clamps 24, 26 are similar structures. An acceptable clamps can be used, one example of which is shown. Of course, other mechanical clamps or connections to members could be used from the many available.

The clamps 24 and 26 each include a first clamping member 58 and a second clamping member 60 in opposed, spaced apart relation. The first and second clamping members 58, 60 are elongated metal plates with a surface for supporting electrical conductors therebetween.

The leaf spring 50 is bolted to the clamps 24 and 26 by a bolt 72 and a nut 102, best seen in FIG. 4. The spring's width 55 at the connection to the clamps 24 and 26 is selected to match the clamps and provide a solid connection. In this embodiment, the connection region 55 is wider with a neck down section 57 and a body section 59, though it could be the same width if desired.

A pair of coil compression springs 78 bias the first and second clamping members 58, 60 away from each other, toward an unclamped position. The coil compression springs 78 are disposed about the rear fasteners 72, at the rear of the clamping members 58, 60 to retain the coil compression springs 78 on the respective clamping member 58,60.

The two front fasteners 74 are threaded and serve as final fasteners at the front of the clamping members 58, 60 to hold the electrical connections in a solid position between the clamping members 58, 60. (The rear fasteners 72 can serve as alignment pins and fasteners.) The threads of the front fasteners 74 engage a respective portion of the first and second clamping members 58, 60 to move the first and second clamping members 58, 60 with respect to one another. For example, a lower threaded portion of the front fasteners 74 (FIGS. 3 and 4) engages a thread in the hole 76 of the second clamping member 60, while an upper threaded portion of the front fastener 74 engages a thread in the hole 76 of the first clamping member 58. Thus, the distance or space 80 between the clamping members 58, 60 can be adjusted by rotating the front fasteners 74.

Although specific embodiments of and examples for, the invention are described herein for illustrative purposes, various equivalent modifications can be made without departing from the spirit and scope of the invention, as will be recognized by those skilled in the relevant art. The teachings provided herein of the invention can be applied to other electrical conductors, not necessarily the exemplary clamping electrical conductor generally described above. Aspects of the invention can be modified, if necessary, to employ systems, circuits and concepts of the various patents, applications and publications to provide yet further embodiments of the invention.

We claim:

1. A device for electrically coupling two circuit boards to each other, comprising:
   a first clamp connected to a first circuit board;
   a second clamp connected to a second circuit board;
   a leaf spring mechanically coupled to the first and the second clamps; and
   a first flexible electrical conductor extending between the first clamp and the second clamp and electrically coupling the two circuit boards to each other.

2. The device according to claim 1 wherein the first and the second clamps each have an elongated opening and a first and a second end of the leaf spring are secured to the first and the second clamps, respectively.

3. The device according to claim 1 wherein the leaf spring includes a preset camber.

4. The device according to claim 1 wherein the flexible electrical conductor comprises a circuit substrate having a plurality of traces formed on a flexible circuit substrate.

5. The device according to claim 4, further comprising:
   a second flexible circuit substrate extending between the first clamp and the second clamp, the second flexible circuit substrate being electrically isolated from the first flexible circuit substrate.

6. The device according to claim 5 wherein the second flexible substrate is below the first flexible substrate with first and second flexible substrates positioned one on top of the other.

7. The device according to claim 5 wherein the second flexible substrate is adjacent the first flexible substrate with the first and second flexible substrate extending side by side along the leaf spring.

8. The device according to claim 1 wherein the flexible electrical conductor comprises a ribbon electrical cable.

9. The device according to claim 1 wherein the first and the second clamps each include a pair of opposed clamping members, the clamping members of each of the first and the second clamps being movable with respect to the opposed clamping member between a clamped position and an unclamped position spaced from the clamped position.

10. The device of claim 6, further comprising:
for each of the clamps, at least one frame positioned between the opposed clamping members of each of the first and the second clamps, each of the frames having a clamp alignment member that aligns the frame with respect to at least one of the clamping members and a circuit path alignment member that aligns the first flexible electrical conductor with the frame.

11. A device for coupling electrical circuits, comprising:
a first mechanical connector having an opening for coupling to a circuit board;
a second mechanical connector having an opening for coupling to a circuit board;
a resiliently deformable support member extending between the first and second mechanical connectors; and
a flexible electrical conductor extending between the first and the second mechanical connectors.

12. The electrical coupling device of claim 11, further comprising:
a second flexible electrical conductor extending between the first and the second mechanical connectors parallel to the first flexible electrical conductor.

13. The electrical coupling device of claim 11 wherein the resiliently deformable support member curves around a lateral axis that is approximately parallel to the elongated opening of the first mechanical connector such that the second mechanical connector is translatable along a longitudinal axis extending between the first and the second mechanical connectors.

14. The electrical coupling device of claim 11 wherein the resiliently deformable support member is sufficiently stiff about a longitudinal axis extending between the first and the second mechanical connectors to limit rotation of the second mechanical connector about the longitudinal axis to less than 45 degrees when the second mechanical connector is not connected to a circuit board.

15. The electrical coupling device of claim 11 wherein a width, a length, a thickness, and a material of the deformable support sheet are selected such that a stiffness of the resiliently deformable support member is sufficient to limit a motion of the second mechanical connector about an axis that when the second mechanical connector is not connected to a circuit board.

16. The device according to claim 11 wherein the resiliently deformable support member is a stainless steel leaf spring.

17. The electrical coupling device of claim 11 wherein the first mechanical connector includes a first clamping member opposed to, and spaced from, a second clamping member, the space between the first and the second clamping members forming the elongated opening, the first and the second clamping members movable with respect to one another to vary the space between the first and second clamping members.

18. A device for coupling electrical circuits, comprising:
a first mechanical connector having an elongated opening for receiving an edge of a circuit board;
a second mechanical connector having an elongated opening for receiving an edge of a circuit board;
a support sheet coupling the first mechanical connector to the second mechanical connector, the support sheet sufficiently stiff to limit rotation of the second mechanical connector with respect to the first mechanical connector about a longitudinal axis extending along a length of the support sheet extending between the first and the second mechanical connectors, and the support sheet resiliently deformable about a lateral axis perpendicular to the longitudinal axis and approximately parallel to the elongated opening of the first mechanical connector to permit translation of the second mechanical connector with respect to the first mechanical connector along the longitudinal axis; and
a first flexible electrical conductor extending between the first and the second mechanical connectors parallel to the support sheet.

19. The device of claim 18 wherein the first and the second mechanical connectors each include:
a first clamping member opposed to and spaced from a second clamping member, the space between the first and the second clamping members forming the elongated opening, the first and the second clamping members movable with respect to one another to vary the space between the first and second clamping members.

20. The coupling device of claim 18 wherein the first and the second mechanical connectors each include:
at least a first adjustable clamp adjustment member engaging the first and the second clamping members to selectively adjust the space therebetween.

21. A device for electrically coupling two circuit boards to each other, comprising:
a first clamp connected to a first circuit board;
a second clamp connected to a second circuit board;
a first flexible electrical conductor extending between the first clamp and the second clamp; and
a leaf spring detached from the first flexible electrical conductor and mechanically coupled to the first and the second clamps.

22. The device according to claim 21 wherein the first and the second clamps each have an elongated opening and a first and a second end of the leaf spring are secured to the first and the second clamps, respectively.

23. The device according to claim 21 wherein the leaf spring includes a preset camber.

24. The device according to claim 21 wherein the flexible electrical conductor comprises a circuit substrate having a plurality of traces formed on a flexible circuit substrate.

25. The device according to claim 24, further comprising:
a second flexible circuit substrate extending between the first clamp and the second clamp, the second flexible circuit substrate being electrically isolated from the first flexible circuit substrate.

26. The device according to claim 25 wherein the second flexible substrate is below the first flexible substrate with first and second flexible substrates positioned one on top of the other.

27. The device according to claim 25 wherein the second flexible substrate is adjacent the first flexible substrate with the first and second flexible substrate extending side by side along the leaf spring.

28. The device according to claim 21 wherein the flexible electrical conductor comprises a ribbon electrical cable.

29. The device according to claim 21 wherein the first and the second clamps each include a pair of opposed clamping members, the clamping members of each of the first and the second clamps being movable with respect to the opposed clamping member between a clamped position and an unclamped position spaced from the clamped position.

30. The device of claim 26, further comprising:
for each of the clamps, at least one frame positioned between the opposed clamping members of each of the first and the second clamps, each of the frames having a clamp alignment member that aligns the frame with respect to at least one of the clamping members and a circuit path alignment member that aligns the first flexible electrical conductor with the frame.

31. A device for coupling electrical circuits, comprising:
a first mechanical connector having an opening for coupling to a circuit board;
a second mechanical connector having an opening for coupling to a circuit board;
a resiliently deformable support member extending between the first and second mechanical connectors; and
a flexible electrical conductor extending between the first and the second mechanical connectors and spaced away from the support member, the flexible conductor being moveable with respect to the support member.

32. The electrical coupling device of claim 31, further comprising:
a second flexible electrical conductor extending between the first and the second mechanical connectors parallel to the first flexible electrical conductor.

33. The electrical coupling device of claim 31 wherein the resiliently deformable support sheet curves around a lateral axis that is approximately parallel to the elongated opening of the first mechanical connector such that the second mechanical connector is translatable along a longitudinal axis extending between the first and the second mechanical connectors.

34. The electrical coupling device of claim 31 wherein the resiliently deformable support sheet is sufficiently stiff about a longitudinal axis extending between the first and the second mechanical connectors to limit rotation of the second mechanical connector about the longitudinal axis to less than 45 degrees when the second mechanical connector is not connected to a circuit board.

35. The electrical coupling device of claim 31 wherein a width, a length, a thickness, and a material of the deformable support sheet are selected such that a stiffness of the resiliently deformable support sheet is sufficient to limit a motion of the second mechanical connector about an axis that when the second mechanical connector is not connected to a circuit board.

36. The device according to claim 31 wherein the resiliently deformable support member is a stainless steel leaf spring.

37. The electrical coupling device of claim 31 wherein the first mechanical connector includes a first clamping member opposed to, and spaced from, a second clamping member, the space between the first and the second clamping members forming the elongated opening, the first and the second clamping members movable with respect to one another to vary the space between the first and second clamping members.

* * * * *